United States Patent [19]

Pezzani

[11] Patent Number: 5,502,329
[45] Date of Patent: Mar. 26, 1996

[54] PROTECTION COMPONENT FOR AUTOMOBILE CIRCUIT

[75] Inventor: Robert Pezzani, Vouvray, France

[73] Assignee: SGS-Thomson Microelectronics S.A., Saint-Genis, France

[21] Appl. No.: 300,172

[22] Filed: Sep. 1, 1994

Related U.S. Application Data

[63] Continuation of Ser. No. 10,269, Jan. 28, 1993, abandoned.

[30] Foreign Application Priority Data

Jan. 31, 1992 [FR] France .................. 92 01311

[51] Int. Cl.⁶ .................................................. H01L 29/00
[52] U.S. Cl. ..................... 257/546; 257/654; 257/551; 257/355
[58] Field of Search .......................... 257/355, 356, 257/357, 362, 551, 654, 603, 546, 552, 105, 106, 173

[56] References Cited

U.S. PATENT DOCUMENTS

| | | | |
|---|---|---|---|
| 3,396,317 | 8/1968 | Vendelin | 257/654 |
| 3,940,785 | 2/1976 | Genesi | 257/546 |
| 4,100,561 | 7/1978 | Ollendorf | 257/362 |
| 4,211,941 | 7/1980 | Schade, Jr. | 257/551 |
| 4,222,088 | 9/1980 | Burton | 361/172 |
| 4,577,211 | 3/1986 | Bynum et al. | 257/546 |
| 4,705,322 | 11/1987 | Yéannoulos | 257/546 |
| 4,888,623 | 12/1989 | Enomoto et al. | 257/551 |
| 4,984,061 | 1/1991 | Matsumoto | 257/758 |
| 5,338,964 | 8/1994 | Bernier | 257/355 |
| 5,401,985 | 3/1995 | Anceau | 257/173 |

FOREIGN PATENT DOCUMENTS

| | | | |
|---|---|---|---|
| 0318404 | 5/1989 | European Pat. Off. | |
| 63-246859 | 10/1988 | Japan | 257/356 |

OTHER PUBLICATIONS

"The time base circuit," *Electronics*, Apr. 26, 1971, p. 42.

*Primary Examiner*—Sara W. Crane
*Assistant Examiner*—Courtney A. Bowers
*Attorney, Agent, or Firm*—David M. Driscoll; James H. Morris

[57] ABSTRACT

A protection monolithic semiconductor component has an input terminal, an output terminal and a reference terminal. The component includes between the input terminal and output terminal, a first diode of a first polarity having a low forward dissipation and a reverse breakdown voltage ranging from 20 to 40 volts; and, between the output terminal and reference terminal, a second protection diode having the same polarity. The first diode is laterally disposed between two electrodes of the front surface of the component, and the second diode is vertically disposed between an electrode on the front surface of the component and an electrode on the rear surface.

22 Claims, 1 Drawing Sheet

PROTECTION COMPONENT FOR AUTOMOBILE CIRCUIT

This application is a continuation of application Ser. No. 08/010,269, filed Jan 28, 1993, now abandoned.

1. Field of the Invention

The present invention relates to a protection circuit, and more particularly to a protection circuit for the protection of integrated circuits mounted on automobile vehicles.

2. Discussion of the Related Art

Automobile vehicles are power fed by batteries having a standardized D.C. voltage, generally 12 V for touring cars and 24 V for trucks. Protection components are intended to avoid transmission of over voltages by the supply wires of electronic circuits in such vehicles and, therefore, generally have triggering thresholds selected within a 20–40 volt range, in order to allow for the flow of normal supply voltage, which may vary about the mean value, and to protect against accidental overvoltages, occurring particularly frequently in the automobile vehicle field, that may result, most commonly from abrupt breaker switching.

Additionally, an electronic circuit realized in the form of an integrated circuit can be destroyed if the polarity is reversed between its supply terminals, a problem which is particularly likely to occur in the field of automobile vehicles because repairs are not generally carried out by electronics engineers but by mechanics.

Therefore, it is desired to provide protection not only against the above mentioned overvoltages but also against a possible inversion in the battery's polarity caused by an improper connection. It is to be noted that one of the possible causes of an overvoltage is spurious disconnection of the battery while the vehicle alternator is operating. In that case, the whole energy supplied by the alternator, instead of being absorbed by the battery, is provided into the circuit at a high voltage that can reach approximately 100 volts. This phenomenon is usually referred to as a "load dump".

The conventional method to avoid these various drawbacks is to dispose a rectifying diode in series with the battery. This diode prevents the current from flowing in reverse direction if the battery polarity is reversed. The diode is generally protected by a parallel avalanche diode. Indeed, in practice, diodes intended to operate in avalanche mode have a relatively high forward dissipation. Thus, the protection diode is removed from the avalanche role. To avoid problems such as load dump or another type of overvoltage on the supply line, an avalanche diode is conventionally disposed between the supply line and the reference line (generally the ground) formed by the vehicle framework. This avalanche diode must be capable of absorbing high energies occurring such as a load dump.

FIG. 1 illustrates this conventional protection method, provided by three discrete components. A battery E provides a voltage between a terminal 1 and ground G. Battery E is connected to the input terminal 2 of an electronic circuit C to be protected, such as an electric window control circuit, through a group of protection components including a series rectifying diode D1, an avalanche diode T2 in parallel with diode D1, and an avalanche diode T1 disposed between terminal 2 and ground.

SUMMARY OF THE INVENTION

An object of the present invention is to realize the combination of components T2, D1 and T1 within a monolithic component while maintaining the advantages of a low forward voltage drop between terminals 1 and 2.

The advantages of such a monolithic implementation will clearly appear to those skilled in the art and particularly includes a decrease in costs and the elimination of possible mounting errors.

To achieve this object and others, the invention provides a monolithic protection semiconductor component having an input terminal, an output terminal and a reference terminal, including, between the input terminal and the output terminal, a first diode of a first polarity having a low forward dissipation and a reverse breakdown voltage ranging from 20 to 40 volts, and, between the output terminal and the reference terminal, a second protection diode having the same polarity. The first diode is laterally disposed between two electrodes of the front surface of the component. The second diode is vertically disposed between an electrode on the front surface of the component and an electrode on the rear surface.

According to an embodiment of the invention, the component includes on the front surface of the substrate, a first region of a second conductivity type and a second highly doped region of the first conductivity type, these first and second regions having substantially complementary profiles. On the rear surface of the substrate, a third region of the second conductivity type occupies practically the whole rear surface area. According to an embodiment of the invention, the substrate has a doping level approximately within the range of $10^{17}$ to $10^{18}$ atoms/cm$^3$.

According to an embodiment of the invention, the limit between the first and second regions is digitized.

According to an embodiment of the invention, the rear surface area is metallized and mounted on a heat sink.

It will be noted that with this structure, although the first diode is laterally disposed, given the relatively high doping level of the substrate and its relatively large thickness, as well as the possible digitizing of the lateral diode, a first diode having a low consumption in forward mode and the desired characteristic in reverse mode is obtained.

The foregoing and other objects, features, aspects and advantages of the invention will become apparent from the following detailed description of the present invention which should be read in conjunction with/the accompanying drawings.

BRIEF DESCRIPTION OF DRAWINGS

In FIGS. 2A and 2B, as is conventional in integrated circuit representation, sizes are not drawn to scale but are arbitrarily enlarged to facilitate legibility of the figures. Additionally, junction edges are represented with right angles whereas, in practice, junction edges have rounded-up shapes resulting from diffusion steps.

DETAILED DESCRIPTION

Figure 1:
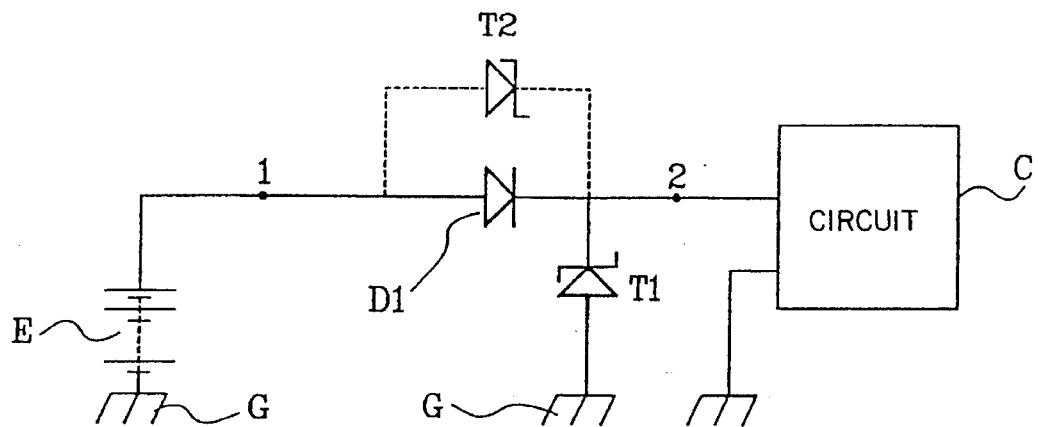
FIG. 1 is a diagram of a conventional protection electronic circuit for an automobile vehicle.
Figure 2A:
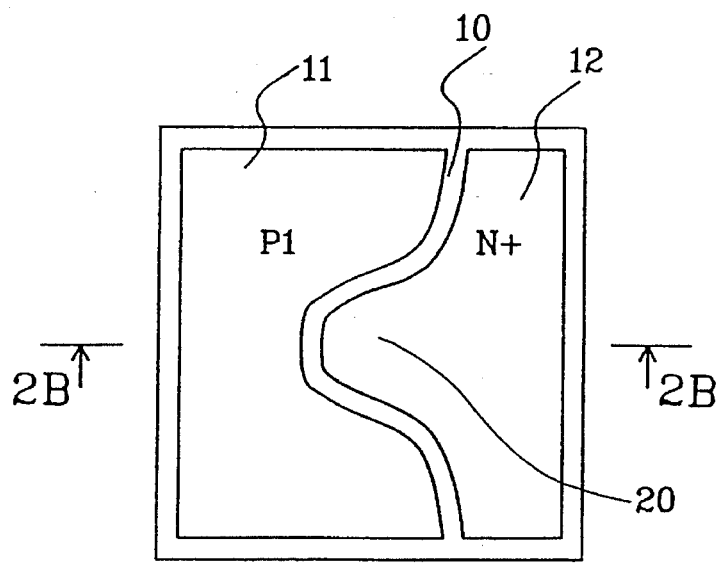
FIG. 2A is a top schematic view of an embodiment of a monolithic component according to the invention, this top view showing the shape of the junctions.
Figure 2B:
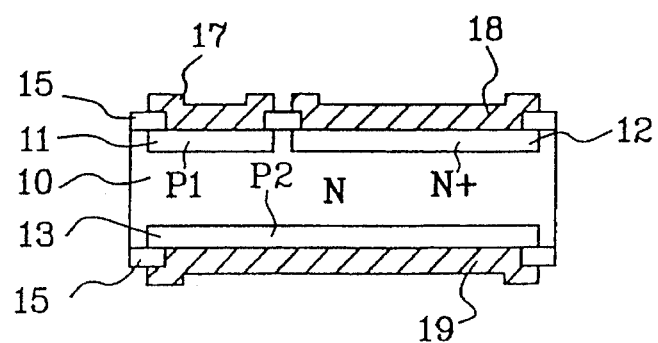
FIG. 2B is a schematic cross-sectional view of the component taken along line B—B of FIG. 2A.

In the embodiment of FIGS. 2A and 2B, a monolithic component according to the invention is formed from an N-type substrate 10 having a thickness corresponding to the conventional thickness of a silicon wafer, that is, approximately 0.3 mm. In a first region of the upper surface of the substrate there is formed a P-type region 11, P1, and in the substantially complementary portion there is formed an N-type region 12. Region 12 has a high doping level ($N^+$) with respect to the doping level of substrate 10. In the lower surface of the substrate there is formed a P-type region 13, P2. The layers designated by reference numeral 15 are isolating layers which may have served as a mask during formation of regions 11, 12 and 13, and are usually of silicon oxide. The apparent surfaces of regions 11, 12 and 13 are respectively coated with metallizations 17, 18 and 19. Metallizations 17, 18, 19, which serve as electrodes, are intended to be respectively connected to terminals 1, 2 and G described with reference with FIG. 1.

In this component, the diodes D1 and T2 (FIG. 1) are formed between electrodes 17 and 18 by the junction between regions $P_1$ and N (10). Avalanche diode T1 is formed between electrodes 18 and 19 by junction $NP_2$.

It will be demonstrated that, despite the preconception generally associated with the use of lateral diodes, the lateral diode $P_1NN^+$ between electrodes 17 and 18 has a low forward voltage drop and the obtained component allows for a satisfactory adjustment of avalanche voltages ages at the desired protection level, the limitation of parasitic effects (associated with the $P_1NP_2$ transistor) and has good energy withstanding characteristics.

It should be noted that, in the case of an avalanche diode, the breakdown voltage of the junction is mainly defined by the doping level of the least doped layer forming the junction. Thus, in the structure of FIG. 2B, for the avalanche diodes T2 (junction $P_1N$) and T1 (junction $P_2N$), the avalanche voltage is mainly determined by the doping level of the N region (10). Indeed, it is well known that, when a layer is diffused, such as layers $P_1$ and $P_2$, in a region of the opposite conductivity type, the operation is in practice only possible if it is desired to reach doping levels of the diffused regions higher than the doping level of the region in which these layers are diffused. Thus, to reach, as indicated above, an avalanche voltage of approximately 20 to 40 volts, N region 10 must be relatively highly doped, that is, have a resistivity approximately within the range of 20 milliohms-cm to 0.1 ohm-cm (or a doping level of $10^{17}$ to $10^{18}$ atoms/cm$^3$).

Additionally, due to the fact that the N layer 10 forms the substrate of the monolithic component, its thickness after formation of the $P_1$ and $P_2$ regions, between these $P_1$ and $P_2$ regions, is approximately greater than or equal to 0.2 mm. Taking into account the resistivity and thickness of the N layer (10), the forward access resistance of diode $P_1NN^+$ is low. In fact, this resistance is proportional to the resistivity of region 10 and inversely proportional to its thickness. In addition, FIG. 2A shows, as a top view, that $N^+$ region 12 forms a finger 20 penetrating into the P1 region so as to increase the junction length. This junction length can be further increased by forming multiple fingers, or "interdigitizing". As the interdigitizing is increased (i.e., more fingers are formed), the junction length is increased. An increase of interdigitizing also decreases the access resistance. Thus, despite the fact that diode $P_1NN^+$ is a lateral structure, quite satisfactory forward voltage drop values are obtained. For example, forward voltage drop values $V_f$ approximately lower than 1.1 V are obtained for a current density of approximately 1 A/mm$^2$, and approximately lower than 1.5 V for a current density of approximately 4 A/mm$^2$.

For the same reasons as those mentioned above, the avalanche operation of the $N+NP_1$ diode is little affected by its lateral structure with regard to its capacity of withstanding reverse overvoltages. Indeed, the laws concerning the above-mentioned thickness and resistivity values lead to the diode being able to withstand values of approximately 400 W/cm$^2$, which is very close to the values obtained with a conventional vertical structure.

The critical operating point of the proposed structure corresponds to the case when diode D1 ($P_1NN^+$) is forward biased and diode T1 (junction $P_2N$) is reverse biased and not in the avalanche mode. This is the normal operating mode when the circuit to be protected consumes current to control a vehicle device (such as a window motor) fed by the voltage of the battery. Under these conditions, it can be seen that a parasitic transistor $P_1NP_2$ exists, the base current $I_b$ of which is the current provided to the protected circuit, and the collector current of which is the leakage current of junction $P_2N$. In fact, it can be seen that the high current gain of the parasitic transistor is approximately lower than or equal to 0.01. This value is quite tolerable and results from the above mentioned large thickness and low resistivity of N region 10. It will be understood by those skilled in the art that the low gain of the parasitic transistor is obtained without providing any additional steps for creating traps, such as the introduction of gold or platinum diffusion. This is very important for the operation of the device because, in a conventional case in which the PNP structure has a significant transistor effect with a gain higher than 0.1 or 1, the structure would not meet the requirements for providing the desired function.

It should be appreciated, for the same reasons, that the recovery time of diode D1 is inherently rapid (approximately lower than 0.5 microsecond).

According to a further advantage of the present invention, junction $NP_2$ withstands high surges. Indeed, junction $NP_2$ must protect an integrated circuit against high energy parasitic pulses (such as those resulting from a load dump). This energy can reach several tens of joules. It is clear that optimal cooling and a maximum size of the junction are advantageous. The structure according to the invention exhibits all these advantages since junction $NP_2$ occupies the greatest tolerable space in a given chip size taking into account the spaces necessary at the periphery of the junction. Additionally, the junction is disposed close to the cooled side of the chip, since it is on the ground side and can be welded to a heat sink at the vehicle chassis potential. This welding can be made without insulation with respect to the vehicle framework, which renders the chip compatible with power surface mounted components or conventional TO220-type cases.

As is apparent to those skilled in the art, various modifications can be made to the above disclosed specific embodiments, especially with regard to the method for obtaining the various doped regions and their layout.

Having thus described one particular embodiment of the invention, various alterations, modifications, and improvements will readily occur to those skilled in the art. Such alterations, modifications, and improvements as are made obvious by this disclosure are intended to be part of this disclosure though not expressly stated herein, and are intended to be within the spirit and scope of the invention. Accordingly, the foregoing description is by way of example only and is not intended as limiting. The invention is limited only as defined in the following claims and the equivalents thereto.

What is claimed is:

1. A monolithic semiconductor protection component having a front surface and a rear surface, and having an input terminal, an output terminal and a reference terminal, the component comprising:

a first P/N junction diode coupled between the input and output terminals, the first P/N junction diode having a low forward voltage dissipation and a reverse breakdown voltage essentially within the range of 20 to 40 volts;

a second, protection, P/N junction diode coupled between the output terminal and the reference terminal; and first, second and third electrodes, wherein the first and second electrodes are disposed on the front surface of the component and the third electrode is disposed on the rear surface of the component;

wherein the first P/N junction diode is laterally disposed between the first and second electrodes on the front surface of the component, and the second P/N junction diode is vertically disposed between the second electrode and the third electrode.

2. A component as claimed in claim 1 further comprising:

a substrate of a first conductivity type having a front surface corresponding to the front surface of the component and a rear surface corresponding to the rear surface of the component;

a first region of a second conductivity type disposed on the front surface of the substrate;

a second region, being more heavily doped than the substrate, of the first conductivity typed disposed on the front surface of the substrate, wherein the first and second regions have substantially complementary profiles; and a third region of the second conductivity type disposed on the rear surface of the substrate and occupying substantially the entire rear surface of the substrate.

3. A component as claimed in claim 2 wherein the substrate has a doping level essentially within the range of $10^{17}$ to $10^{18}$ atoms/cm$^3$.

4. A component as claimed in claim 2 wherein the first and second regions are interdigitized.

5. A component as claimed in claim 3 wherein the first and second regions are interdigitized.

6. A component as claimed in claim 1 further comprising a metallized layer disposed on the rear surface of the component.

7. A component as claimed in claim 2 further comprising a metallized layer disposed on the rear surface of the component.

8. A component as claimed in claim 3 further comprising a metallized layer disposed on the rear surface of the component.

9. A component as claimed in claim 4 further comprising a metallized layer disposed on the rear surface of the component.

10. A component as claimed in claim 5 further comprising a metallized layer disposed on the rear surface of the component.

11. A component as claimed in any one of claims 1–10 further comprising:

an integrated circuit for protection, the integrated circuit being coupled to the diodes; and an automobile battery to which the integrated circuit is coupled.

12. A monolithic semiconductor protection component comprising:

an input terminal, an output terminal and a reference terminal;

a first surface and a second surface;

a first P/N junction diode coupled between the input and output terminals, the first P/N junction diode having a low forward voltage dissipation and a reverse breakdown voltage essentially within the range of 20 to 40 volts; and a second, protection, P/N junction diode coupled between the output terminal and the reference terminal;

wherein the first P/N junction diode is disposed on the first surface of the component and the second P/N junction diode is disposed between the first and second surfaces of the component.

13. A component as claimed in claim 12 further comprising:

first, second and third electrodes, wherein the first and second electrodes are disposed on the first surface of the component and the third electrode is disposed on the second surface of the component;

wherein the first P/N junction diode is disposed between the first and second electrodes on the first surface of the component, and the second P/N junction diode is disposed between the second electrode and the third electrode.

14. A component as claimed in claim 13 further comprising:

a substrate of a first conductivity type having a first surface corresponding to the first surface of the component and a second surface corresponding to the second surface of the component;

a first region of a second conductivity type disposed on the first surface of the substrate;

a second region, being more heavily doped than the substrate, of the first conductivity typed disposed on the first surface of the substrate, wherein the first and second regions have substantially complementary profiles; and a third region of the second conductivity type disposed on the second surface of the substrate and occupying substantially the entire second surface of the substrate.

15. A component as claimed in claim 14 wherein the substrate has a doping level essentially within the range of $10^{17}$ to $10^{18}$ atoms/cm$^3$.

16. A component as claimed in claim 15 wherein the first and second regions are interdigitized.

17. A component as claimed in claim 16 further comprising a metallized layer disposed on the second surface of the component.

18. A monolithic semiconductor protection component comprising:

an input terminal, an output terminal, and a reference terminal;

a first surface and a second surface;

means, coupled between the input and output terminals, for allowing current to flow from the input terminal to the output terminal when a forward biased voltage is applied to the input terminal and allowing current to flow from the output terminal to the input terminal when a reverse biased voltage, essentially within the range of 20 to 40 volts, is applied to the input terminal, the means for allowing including a first P/N junction diode; and means for protecting against voltage surges, coupled between the output terminal and the reference terminal;

wherein the means for allowing is disposed on the first surface of the component and the means for protecting is disposed between the first and second surfaces of the component.

19. A component as claimed in claim 18 further comprising:
   first, second and third electrodes, wherein the first and second electrodes are disposed on the first surface of the component and the third electrode is disposed on the second surface of the component;
   wherein the means for allowing is laterally disposed between the first and second electrodes on the first surface of the component, and the means for protecting is vertically disposed between the second electrode and the third electrode.

20. A component as claimed in claim 18 further comprising a substrate having a doping level essentially within the range of $10^{17}$ to $10^{18}$ atoms/cm$^3$.

21. A component as claimed in claim 19 including first and second regions are interdigitized.

22. A component as claimed in claim 20 further comprising a metallized layer disposed on the second surface of the component.

* * * * *